(12) United States Patent
Felps

(10) Patent No.: US 6,181,264 B1
(45) Date of Patent: Jan. 30, 2001

(54) PRECISION BIPOLAR DIGITAL-TO-ANALOG CONVERTER FOR AN INSTRUMENT PROBE INTERFACE

(75) Inventor: Jimmie D Felps, Colorado Springs, CO (US)

(73) Assignee: Agilent Technologies, Palo Alto, CA (US)

( * ) Notice: Under 35 U.S.C. 154(b), the term of this patent shall be extended for 0 days.

(21) Appl. No.: 09/314,488

(22) Filed: May 18, 1999

(51) Int. Cl.$^7$ ................................................. H03M 1/66
(52) U.S. Cl. ............................................................ 341/144
(58) Field of Search ..................................... 341/155, 152, 341/144; 360/32

(56) References Cited

U.S. PATENT DOCUMENTS 4,573,039 * 2/1986 Suzuki ................................. 341/152

* cited by examiner

Primary Examiner—Brian Young

(57) ABSTRACT

A precision bipolar digital-to-analog converter (DAC) allows a first DAC channel to provide significantly reduced bipolar zero offset voltage. By supplying an additional DAC output as input to the first DAC channel, bipolar zero offset voltage in the first channel may be significantly reduced.

10 Claims, 3 Drawing Sheets

PRECISION BIPOLAR DIGITAL-TO-ANALOG CONVERTER FOR AN INSTRUMENT PROBE INTERFACE

TECHNICAL FIELD

The present invention relates generally to electronic circuitry, and, more particularly, to a precision bipolar digital-to-analog converter (DAC) for an instrument probe interface.

BACKGROUND OF THE INVENTION

In many programmable electronic and electrical devices it is desirable to convert a digital signal into an analog signal. A DAC was developed and described in commonly assigned U.S. Pat. No. 5,041,831, entitled "INDIRECT D/A CONVERTER", and issued on Aug. 20, 1991 to Bohley, et al, which is hereby incorporated by reference. In the '831 Patent, a plural channel indirect DAC is supplied with data words containing address bits and data bits, which are entered into a specific one of the converter channels under control of the address bits of the data word. The data bits are applied to a binary rate multiplier of the channel which generates a pulse modulated output signal representing the binary value of the received data bits. The pulse modulated output signal is applied to an associated filter which converts the pulse modulated output signal to an analog output signal whose amplitude represents the binary value of the received data bits. Gating circuitry ensures that each output pulse is of a precisely controlled pulse width.

In a particular application, the indirect DAC has 16 output channels, although the indirect DAC may have more or fewer channels depending upon application. Each of the 16 channels are 16-bit DACs. If all 16 bits are used the lowest frequency that will have to be filtered is 10 MHz/$2^{16}$, or 10 MHz/65536, or 152.6 Hz. When used as a 12-bit DAC, the lowest frequency to be filtered is 10 MHz/$2^{12}$, or 10 MHz/4096, or 2.441 kHz. It is desirable to tailor each output filter to match the lowest frequency to be filtered so as to minimize the settling time of going from one DAC setting to the next. Using the minimum number of data bits for a DAC channel for the particular application is desirable to help minimize the filter settling time.

One of the converter channels is used to calibrate the output level of the filters. This channel is referred to as the reference loop. The number of data bits applied to the different channels may need not be the same and may vary in number from a minimum of 1 to a maximum of m.

A drawback in the above-mentioned indirect DAC is that it divides the input clock by 2 before using it for the DAC channels. This clock division is unnecessary since only the period of the clock is used for timing. Unfortunately, this condition doubles the settling time of all the DAC filters since they could have been running at 20 MHz (the IC process limit) instead of 10 MHz.

Another drawback of the above-mentioned DAC is that it requires that one of the DAC output channels be used to supply the filter that comprises the reference loop, the output of which is used to calibrate the output level of the remaining filters on the remaining DAC channels.

Another drawback of the above-mentioned DAC is that, depending upon the number of bits with which the reference channel is programmed (i.e., the number of bits programmed to 1s), there will be a different offset voltage present on each of the other channels. This different offset voltage is caused by the fact that the above-mentioned DAC does not behave like a conventional DAC when the reference channel is programmed to all 1s (a hexadecimal code of FFFF for a 16-bit DAC).

When all 1s are programmed in the reference loop, the digital output is high for 65535 counts of the 10 MHz clock period, or 65535/10 MHz, or 6.5535 milliseconds and low for 1 count, or 1/10 MHz, or 100 nanoseconds. The average voltage of this waveform is compared to the reference voltage, in this case 5 volts (V). This means that all 1s gives the reference voltage as output, not 1 q-level less than the reference that would be expected from a conventional DAC. A q-level on a conventional 16-bit DAC would be equal to +5V/$2^{16}$, or 5/65536, or 76 microvolts ($\mu$V). On the indirect DAC with the reference loop programmed to all 1s for 16 bits, a q-level would be equal to +5V/($2^{16-1}$), or 5/65535, or 76 $\mu$V. In a 16-bit DAC, the error is insignificant, but it does cause the other DAC outputs to be ½ of a q-level high when programmed at mid-scale. This equates to a hexadecimal code 8000 which is a square wave, or (5/65535)(65536/2), or 2.500038V, instead of the expected 2.500V. If the reference channel is programmed for all 1s for 8 bits (hexadecimal code FF00), the error increases and would be equal to $\{5/(2^8-1)\}(2^{8/2})$, or (5/255)(256/2), or 2.509804V not 2.500V. This offset voltage error is particularly troublesome and confusing when the reference loop of different DACs have been programmed to different numbers of bits.

In situations where a highly precise DAC output is desired, this condition leads to the unacceptably high level of offset voltage present on the reference channel. This in turn leads to a situation in which it is difficult to provide the required offset voltage resolution on the reference. For example, in a situation in which an oscilloscope probe is connected to an oscilloscope, DAC output offset range on the order of +/−20V referred to the input of the probe is required, as opposed to DAC output offset range on the order of +/−2V for the attenuator/preamp in an oscilloscope. At the desired +/−20V offset, one q-level is approximately equal to 610 $\mu$V, as opposed to one q-level corresponding to 61 $\mu$V at +/−2V offset. Because higher offset voltage is desired in some instances, it would be desirable to provide a DAC output that is capable of high resolution and yet have minimal errors and drift at the desired output level.

SUMMARY OF THE INVENTION

The invention provides a precision, bipolar DAC output for remote control.

In architecture, the present invention may be conceptualized as a precision bipolar digital-to-analog converter (DAC) having a plurality of outputs, the DAC comprising: a first output channel configured to supply a digital representation of an analog input signal to a filter, the filter providing a particular offset voltage at a particular resolution; and a second output channel configured to supply a digital representation of an analog signal to the filter, the second output configured to improve the resolution of the first output channel. The present invention may also be conceptualized as a method for operating a precision bipolar digital-to-analog converter (DAC) having a plurality of output channels, the method comprising the following step: supplying, from a first output channel, a first digital representation of an analog input signal to a filter, the filter providing a particular offset voltage at a particular resolution; and supplying, from a second output channel, a second digital representation of an analog signal to the filter, the second digital representation configured to improve the resolution of the first output channel.

The invention has numerous advantages, a few of which are delineated, hereafter, as merely examples.

An advantage of the invention is that it allows a DAC to provide a high resolution, precision output.

Another advantage of the invention is that it provides current output for re-referencing the DAC output voltage at the remote destination.

Another advantage of the invention is that it allows a probe interface to have decreased bipolar zero offset voltage.

Another advantage of the invention is that it provides low capacitance electrostatic discharge protection to probe interface circuitry within an oscilloscope.

Another advantage of the invention is that it provides a DAC output having high DC voltage accuracy.

Another advantage of the invention is that it provides a DAC output having low DC voltage drift.

Another advantage of the invention is that it allows the offset voltage of a DAC reference loop to be precisely controlled.

Another advantage of the invention is that it reduces the calibration time for bipolar zero offset calibration.

Another advantage of the invention is increased DAC accuracy and decreased drift with temperature and time due to the use of a resistor pack having guards.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The precision bipolar DAC of the present invention can be implemented in hardware, software, firmware, or a combination thereof In the preferred embodiment(s), the precision bipolar DAC is implemented in hardware. Furthermore, while described as useful in an oscilloscope, the precision bipolar DAC can be used in virtually any application requiring the use of a DAC having a precisely controllable output.

Figure 1:
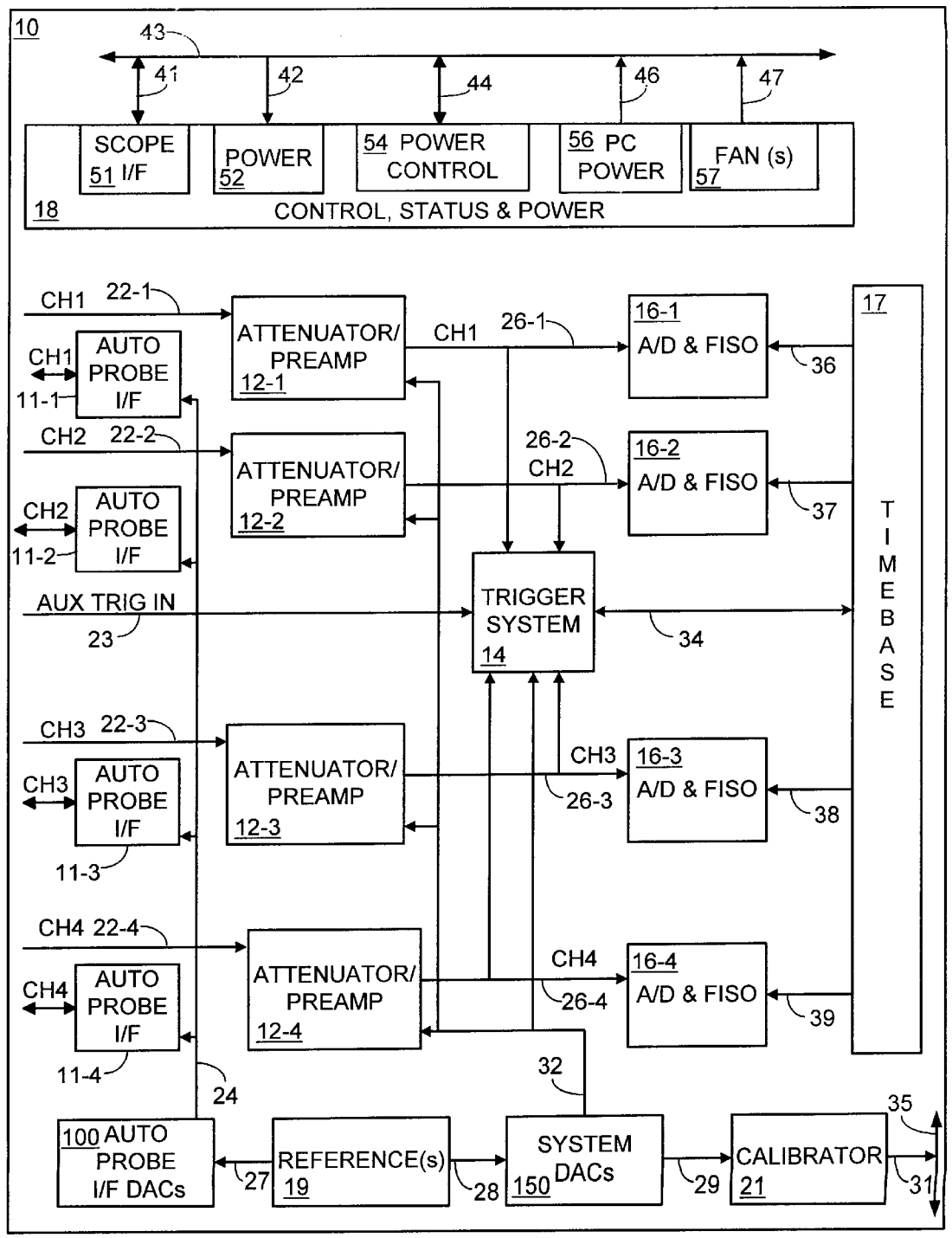
FIG. 1 is a block diagram illustrating an oscilloscope in which the DAC of the present invention resides.

Turning now to FIG. 1, shown is a block diagram view of a typical oscilloscope acquisition system 10. Oscilloscope acquisition system 10 resides within an oscilloscope (not shown) and provides calibration and reference for an oscilloscope and for probes connected to the oscilloscope. Included in acquisition system 10 is control, status and power module 18. Control, status and power module 18 includes a number of modules which communicate with the rest of the oscilloscope via interface 43. Included in control, status and power module 18 is power module 52 which receives power over connection 42 from interface 43. Also included in control, status and power module 18 is scope interface (I/F) module 51. Scope I/F module 51 communicates with interface 43 over connection 41 to control various functions of and to monitor the status of the acquisition system. Power control module 54 communicates with interface 43 over connection 44 to provide power control to oscilloscope acquisition system 10. Personal computer (PC) power module 56 delivers power over connection 46 from interface 43 and provides conditioned power to a PC embedded in the oscilloscope. Fan module 57 provides appropriate fan drive signals over connection 47 through interface 43 to provide cooling to the oscilloscope in which the oscilloscope acquisition system 10 is located.

Also included in oscilloscope acquisition system 10 are a plurality of autoprobe I/F modules 11 and a plurality of attenuator/preamp modules 12. The autoprobe I/F module 11 is an active and passive probe interface that provides power, offset voltage and control to compatible probes to automate the setup for the oscilloscope for the particular probes being used. The attenuator/preamp module 12 provides the appropriate signal conditioning, which may include signal attenuation and/or amplification and input signal buffering for driving the A/D & fast-in-slow-out (FISO) module 16 and the trigger system module 14. Oscilloscope acquisition system 10 may include a plurality of channels 22 each representing a channel over which the oscilloscope acquisition system 10 communicates with the various probes that might be used to provide signals to the oscilloscope. While four channels are illustrated in FIG. 1, it is possible that many different number channels may be included in oscilloscope acquisition system 10.

Channel 22-1 provides a signal in the range of 0 to +/−250V peak, at a frequency in the range of DC to 500 MHz to attenuator/preamp 12-1. Attenuator/preamp 12-1 attenuates and preamplifies the signal supplied over connection 22-1 and provides over connection 26-1 a signal to both trigger system 14 and A/D and fast-in-slow-out memory (FISO) module 16-1. A/D and FISO module 16-1 also receives a signal over connection 36 from timebase module 17. Timebase module 17 provides a variety of timing signals appropriate for converting the CHI analog signal at connection 26-1 to a digital representation. An auxiliary trigger input is also supplied over connection 23 to trigger system 14, which provides an alternative trigger source in addition to the four channels, CH1–CH4, for oscilloscope triggering. Trigger arming, resetting and synchronization are accomplished by the timebase module 17 over connection 34.

Oscilloscope acquisition system 10 also includes a variety of digital-to-analog (DAC) converters, some of which are the precision bipolar DACs of the present invention. For example, reference module 19 communicates over connection 27 to autoprobe I/F DACs 100, and communicates over connection 28 with system DACs 150. Both autoprobe DACs 100 and system DACs 150 are digital-to-analog converters, however, it is the autoprobe I/F DACs 100 that interface with autoprobe I/F modules 11 that include the precision bipolar DAC outputs to be described below in detail with respect to FIG. 2.

System DACs 150 communicate over connection 29 with calibrator 21, which sends a calibration signal over connection 31 to bus 35 (which are external connections) for calibrating the oscilloscope and for calibrating active and passive probes when used in conjunction with the autoprobe I/F DACs 100. Autoprobe I/F DACs 100 send analog signals over connection 24 to autoprobe I/F modules 11, while system DACs 150 send analog signals over connection 32 to attenuator/preamp modules 12 and trigger system 14. The autoprobe I/F DACs 100 and the system DACs 150 are similar in design. Different DAC output ranges are scaled for the particular application, some DAC outputs are unipolar, some are bipolar, and some DAC outputs are current outputs. The autoprobe I/F DACs 100 aid in performing such functions as generating offset voltages for active probes and implementation of an ohmmeter for measuring the probe identification resistor, probe ID, present in active and passive probes. The system DACs 150 control trigger levels and hysteresis in the trigger system 14 as well as offset voltages to the attenuator/preamp module 12.

It should be noted herein that, while described with reference to autoprobe I/F DACs 100 located within an oscilloscope, the precision bipolar DAC of the present invention can be used with any application using an indirect DAC. Furthermore, while illustrated as a single element, autoprobe I/F DACs 100 typically include a plurality of DACs.

Figure 2:
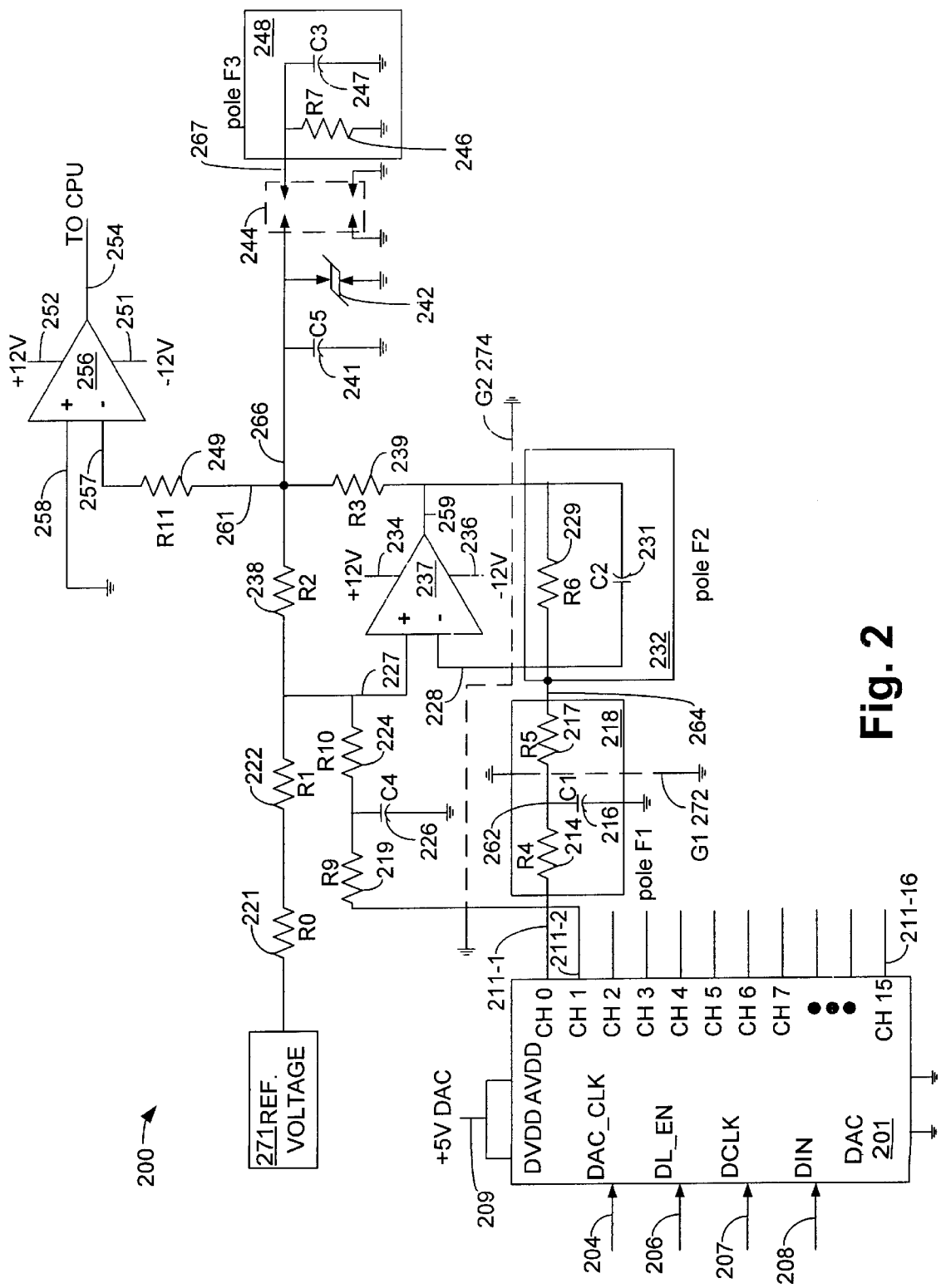
FIG. 2 is a schematic view of one of the DACs of FIG. 1 including a preferred embodiment of the precision bipolar DAC of the present invention.

FIG. 2 is a schematic view of one of the autoprobe I/F DACs 100 of FIG. 1 including a preferred embodiment of the precision bipolar DAC 200 of the present invention. DAC 201 represents an indirect DAC as described in above-mentioned U.S. Pat. No. 5,041,831, and will not be described in detail. Briefly stated, DAC 201 receives a programmable digital input over connection 208 and supplies a 16-bit digital pattern on each of 16 output channels 211-1 through 211-16. The digital patterns on connections 211-1 to 211-16 are then filtered to obtain a DC voltage that represents that pattern. The output of DAC 201 is inherently monotonic in that if a bit is added to the input, then the output will either stay the same or increase. Similarly, if one bit is subtracted from the input, then the output will either stay the same or decrease. That is to say that the monotonicity of the output of DAC 201 assures that the output will not move in a direction opposite that of the input. If a bit is added to the input, then the output will not decrease and if a bit is subtracted from the input, then the output will not increase. Each DAC channel 211-1 to 211-16 can be, in this embodiment, a maximum of 16 bits, each channel being individually controllable. It should be noted that while described as having 16 channels, DAC 201 may have more or fewer channels depending upon application.

The output of each channel is a digital signal whose pattern is representative of a 16 bit word, with any number of those bits being high and low. For example, for a 16 bit channel, as illustrated in above-mentioned U.S. Pat. No. 5,041,831, the output of each channel 211 is a digital signal switching between 0 and 5V with a pulse width that varies in 100 nanosecond (ns) steps from being 0V DC to being 0V for 100 ns and at 5V for 65535*100 ns, or 6.5535 milliseconds (ms). Typically, one DAC channel is used as a reference loop (not shown). Any DAC channel may be used as the reference loop. The reference loop is used to precisely supply a 5V DC supply to DAC 201 over connection 209.

As stated above, one q-level for a 16 bit channel is approximately 76 $\mu$V, while one q-level for an 8 bit DAC channel is approximately 19 millivolts (mV). Because of the discrepancy caused by the manner in which the reference loop is programmed, in the past, programmers had difficulty programming DACs that had the reference loop programmed to different numbers of bits. The DAC 201 of U.S. Pat. No. 5,041,831 describes the reference channel as operating at all 1s. This causes the output swings of the channels to be slightly higher than the 5V reference because the all 1s pattern is 100 ns at 0V and 6.5535 ms at the high level, the average of which is regulated to 5V. In certain applications where fewer than 16 bits are programmed at all 1s, the outputs swing even higher. This condition is addressed in commonly assigned, co-pending U.S. patent application Ser. No. XXX, entitled "IMPROVED REFERENCE LOOP FOR A DIGITAL-TO-ANALOG CONVERTER", filed on XXX, which is hereby incorporated by reference.

As stated above precision DAC 201 is used in situations, such as that mentioned above when connecting probes to an oscilloscope, when +/−20V offset is required. This +/−20V offset is on the order of 10 times more sensitive to errors and drift than offset in the oscilloscope that is +/−2V. The DAC output on channel 0 211-1 is supplied to a reference loop having three filter poles. Filter pole 218 includes capacitor C1 216, resistor R4 214 and resistor R5 217 which is connected to the output of channel 0 211-1 through resistor R4 214. The first filter pole 218 supplies an input to the second filter pole 232 over connection 264.

Second filter pole 232 includes resistor R6 229 and capacitor C2 231. Because DAC channel 0 211-1 is designed to interface to an external oscilloscope probe, the third filter pole 248, which includes resistor R7 246 and capacitor C3 247, would be located remotely from the oscilloscope, i.e., in a scope probe.

The third filter pole 248 connects to DAC output channel 0 211-1 through connector 244. DAC output channel 0 211-1 also includes operational amplifier (op-amp) 237. Op-amp 237 receives the output of first filter pole 218 at its inverting input 228. The non-inverting input of op-amp 237 receives its input over connection 227 from reference voltage source 271 through resistor R0 221 and resistor R1 222. Op-amp 237 receives a +12V power source over connection 234 and receives a −12V power source over connection 236.

The output of op-amp 237 on connection 259 is supplied to op-amp 256 through resistor R3 239 and resistor R1 249 over inverting input 257. The non-inverting input 258 of op-amp 256 is connected directly to ground. Op-amp 256 receives a +12V power source over connection 252 and receives a −12V power source over connection 251. Op-amp 256 is illustratively a high input impedance, field effect transistor (FET) input amplifier that places very light loading on current output node 266. Op-amp 256 is used for mid-scale (bipolar zero offset) calibration of DAC output channel 0 211- 1.

Op-amp 256 senses 0 volts on input 258 and determines over inverting input 257 the DAC input code that corresponds to 0 current output over connection 254. During calibration of DAC channel 0 211-1 the probe (embodied by third pole 248) is illustratively not connected to the channel. Therefore during calibration it is desirable for op-amp 256 to have very high input impedance. Once calibration is complete and the scope probe is connected, bipolar zero offset voltage is significantly reduced.

DAC output channel 0 211 -1 provides a current output over current output node 266 which is converted back to a voltage by resistor R7 246 located within third filter pole 248. The connection 244 where the probe is attached to the oscilloscope is potentially exposed to electrostatic discharges (ESD). ESD protection is included in this preferred embodiment in the form of a sealed spark gap device 242. This type of ESD protection is recommended instead of, for example using a 10 nF capacitor, because it dramatically reduces the bipolar zero offset calibration time. The main contribution to this calibration time is the time required to charge and discharge the capacitance located on the node at current output node 266. Third filter pole 248 is not connected during bipolar zero offset calibration. This charge and discharge time is especially long when the output current at current output node 266 is near zero. This particular current output DAC has an output range of +/−1 milliamp (ma). That means that for 16 bits one q-level is equal to $(2e-3)/(2^{16})$, or $(2e-3)/65536$, or 30.52 nanoamps (na). A capacitor being charged by a constant current source will obey the formula, $T=CV/I$ where T is the time, C is the capacitance, V is the voltage change on the capacitor and I is the current charging the capacitor. In FIG. 2 since there is essentially an open circuit (i.e. the resistance on the current output node 266 is very high) the voltage change that is required on current output node 266 is approximately 12 volts since op-amp 237 may swing into saturation even at a 30.52 na output (1 q-level). Therefore, the time to charge a 10 nF capacitor 12 volts at 30.52 na would be $T=(10e-9)(12)/(30.52e-9)$, or 3.93 seconds.

It is desirable to have some capacitance on the node at current output node 266 because there is a small feedthrough capacitance from channel 0 211-1 through op-amp 237. Capacitor C5 241, 100 pF, shunts the feedthrough signal. Since 100 pF is 1/100 of a 10 nF capacitor, the charge and discharge times would still be 100 times faster, or 39.3 milliseconds for 1 q-level of current. Typical capacitance of spark gap device 242 is less than one picofarad (pF) with a typical trigger voltage of 150V and a typical clamping voltage of 40V.

As stated above, one q-level of offset voltage of DAC channel 0 211-1 is 610 $\mu$V at +/−20V. It is desirable to improve the resolution, such that a smaller bipolar zero offset voltage is obtainable. In order to fine tune the bipolar zero offset (or mid-scale on a unipolar DAC output) on channel 0 211-1, and in accordance with the invention, DAC channel 1 211-2 is added to DAC channel 0 211-1. DAC channel 1 211-2 supplies its output over connection 211-2 and through resistor R9 219, capacitor C4 226 and resistor R10 224 to the non-inverting input 227 of op-amp 237. The addition of DAC channel 1 211-2 allows DAC channel 0 211-1 to provide a significantly improved resolution for bipolar zero offset voltage. In accordance with the invention, offset nulling is accomplished by using second DAC channel 1 211-2 to improve the bipolar zero offset voltage of DAC channel 0. The range of offset nulling (via DAC channel 1 211-2, is 1/101 of the range of the bipolar DAC channel 0 211-1, i.e., (R4 214+R5 217)/(R9 219+R10 224). This equates to 200 kohm/10.1 Megohm. Although illustrated using DAC channel 1 211-2 as the additional input to reference loop 200, any DAC channel may be used. The offset nulling DAC output channel 1 211-2 does not require a three pole filter because its output range is reduced by 1/101 times the main DAC output channel 0 on connection 211-1. The offset nulling pole is set to approximately 67 hertz (Hz). Capacitor C5 241 provides attenuation of feed through coupling that can occur from the fast edges of the digital outputs 211-1 through 211-16 to the output across C5 241. The value of C5 would be kept as low as possible because when connector 244 is disconnected and the scope is performing a bipolar zero offset and an offset null calibration, the time to charge and discharge capacitor C5 241 can be significant. As discussed above, one q-level of current out of the DAC channel 0 211-1 at 16 bits equates to 30.52 nanoamps (na), and one q-level of current out of DAC channel 1 211-2 at 16 bits equates to 1/101 of 30.52 na or 302 picoamps (pa). Since these output currents are constant, the time required to change the voltage across C5 can be determined by the formula $t=VC/i$. This indicates that it would take 393 ms to change the voltage on C5 by 12V at 30.52 na and 3.97 seconds at 302 pa. Therefore, it is more practical to use a portion of the available resolution improvement gained through the use of DAC channel 1 211-2 for offset nulling. A good compromise would be to null the offset with approximately four times the resolution of the DAC channel 0 211-1, which equates to programming DAC channel 1 211-2 to 14 bits. In most applications this would be sufficient and the calibration time would not be excessive. Also in a situation in which there are multiple remote control channels the calibration routines for all channels should be done in parallel so settling times can be done simultaneously to reduce calibration times.

Figure 3:
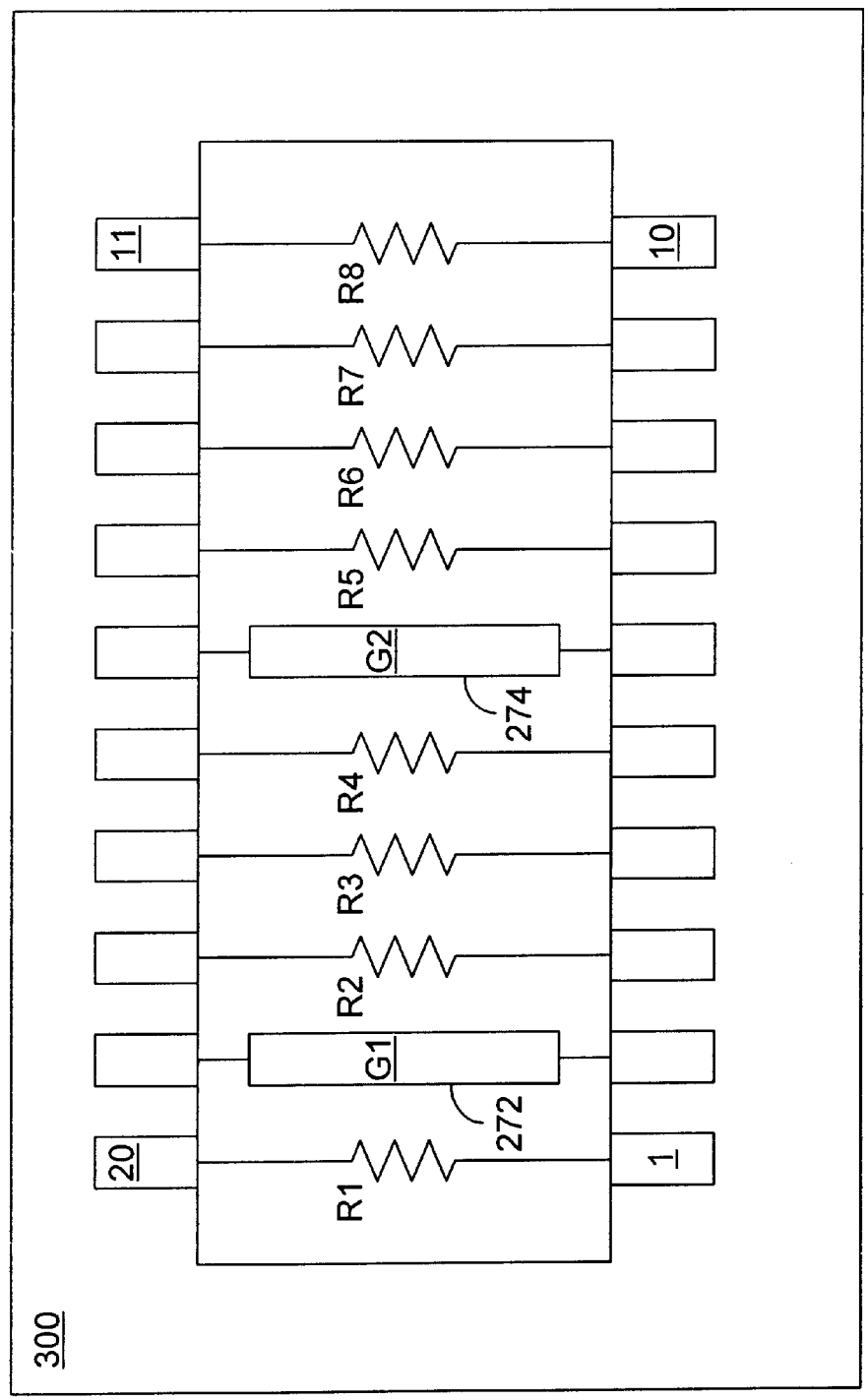
FIG. 3 is a schematic view of a precision resistor package used by the DAC of FIG. 2.

FIG. 3 is a schematic view illustrating a precision resistor package 300 used in the precision bipolar DAC of FIG. 2. To improve the DC voltage accuracy and drift in the circuit depicted in FIG. 2, a precision resistor network 300 having guard straps may be employed. Guard straps 272 and 274 are shunts that minimize capacitance between the resistors R1 through R8 in resistor pack 300. By employing precision resistors in a precision resistor network 300 the voltage accuracy and drift errors attributable to the resistors shown in FIG. 2 could be improved to 0.2% and 25 (PPM)/° C., respectively.

Referring now to FIGS. 2 and 3, resistor R0 221 in FIG. 2 can be replaced by resistor R5 in resistor pack 300 of FIG. 3. Similarly resistor R1 222 and resistor R2 238 of FIG. 2 may replaced by resistor R6 in resistor pack 300 of FIG. 3 and resistor R7 of resistor pack 300 in FIG. 3, respectively. Resistor R3 239 in FIG. 2 can be replaced by resistor R8 in resistor pack 300 of FIG. 3, and resistors R4 214 and R5 217 can be replaced by resistor R1, and resistor R2 of resistor pack 300 of FIG. 3. Finally, resistor R6 229 of FIG. 2 can be replaced by resistors R3 and R4 of resistor pack 300 of FIG. 3. In addition resistor pack 300 includes guard straps 272 and 274, which minimize capacitance between the resistors R1 through R8 in resistor pack 300. Guard G1 272 of resistor pack 300 is shown in FIG. 2 between resistor R4 214 and resistor R5 217. Guard G2 274 of resistor pack 300 is shown between resistors R4 214, R5 217 and R6 229 and resistors R0 221, R1 221, R2 238 and R3 239 of FIG. 2. Guards 272 and 274 provide electrical shorting between the nodes to which they are connected and serve to minimize the effective capacitance between the resistors in precision resistor package 300. The combination of the precision resistor package 300 including guards 272 and 274 improve the accuracy of DAC channel 0 211-1 and significantly reduce the noise coupled from DAC channel 0 211-1 to current output node 266.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. For example, various component values may be used, depending upon the particular application, without departing from the scope of the invention. All such modifications and variations are intended to be included herein within the scope of the present invention.

What is claimed is:

1. A precision bipolar digital-to-analog converter (DAC) having a plurality of outputs, the DAC comprising:

a first output channel configured to supply a digital representation of an analog input signal to a filter, said first output channel providing a bipolar zero offset voltage at a first resolution; and a second output channel configured to supply a digital representation of an analog signal to said filter, said second output channel providing zero offset nulling to said first output channel, thereby reducing said bipolar zero offset voltage of said first output channel to a second resolution finer than that of said first resolution.

2. The DAC of claim 1, further including an electrostatic discharge protection device in said filter.

3. The DAC of claim 1, wherein said filter provides an interface to an active probe.

4. The DAC of claim 1, wherein said filter includes a plurality of resistors and a plurality of capacitors, said plurality of resistors within a precision resistor network.

5. The DAC of claim 4, wherein said precision resistor network includes a plurality of guards configured to minimize capacitance between said plurality of resistors.

6. The DAC of claim 1, wherein said second output channel improves the resolution of said first output channel by providing bipolar zero offset nulling to said first output channel.

7. A method for operating a precision bipolar digital-to-analog converter (DAC) having a plurality of output channels, the method comprising the steps of:

supplying, from a first output channel, a first digital representation of an analog input signal to a filter, said first output channel providing a bipolar zero offset voltage at a first resolution; and supplying, from a second output channel, a second digital representation of an analog signal to said filter, said second digital representation providing zero offset nulling to said first output channel, thereby reducing said bipolar zero offset voltage of said first output channel to a second resolution finer than that of said first resolution.

8. The method of claim 7, further including the step of including an electrostatic discharge protection device in said filter.

9. The method of claim 7, further including the step of interfacing an active probe to said filter.

10. The method of claim 7, wherein said second output channel improves the resolution of said first output channel by providing bipolar zero offset nulling to said first output channel.

* * * * *